(12) United States Patent
Moghadam et al.

(10) Patent No.: US 11,631,583 B2
(45) Date of Patent: Apr. 18, 2023

(54) RF POWER SOURCE OPERATION IN PLASMA ENHANCED PROCESSES

(71) Applicant: Applied Materials, Inc., Santa Clara, CA (US)

(72) Inventors: Farhad Moghadam, Saratoga, CA (US); Hari Ponnekanti, San Jose, CA (US); Dmitry A. Dzilno, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 253 days.

(21) Appl. No.: 17/075,822

(22) Filed: Oct. 21, 2020

(65) Prior Publication Data

US 2021/0125820 A1  Apr. 29, 2021

Related U.S. Application Data

(60) Provisional application No. 62/926,063, filed on Oct. 25, 2019.

(51) Int. Cl.
| | |
|---|---|
| H01L 21/02 | (2006.01) |
| C23C 16/34 | (2006.01) |
| H01J 37/32 | (2006.01) |
| C23C 16/455 | (2006.01) |
| C23C 16/40 | (2006.01) |

(52) U.S. Cl.
CPC ............ *H01L 21/022* (2013.01); *C23C 16/34* (2013.01); *C23C 16/40* (2013.01); *C23C 16/45542* (2013.01); *H01J 37/32293* (2013.01); *H01L 21/0217* (2013.01); *H01L 21/0228* (2013.01); *H01L 21/02164* (2013.01); *H01L 21/02274* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 4,497,759 A | 2/1985 | Nakagawa et al. | |
| 5,593,741 A | 1/1997 | Ikeda | |
| 5,714,009 A * | 2/1998 | Boling | H01J 37/32211 |
| | | | 118/723 ME |
| 7,442,615 B2 | 10/2008 | Nguyen et al. | |
| 7,682,946 B2 | 3/2010 | Ma et al. | |

(Continued)

FOREIGN PATENT DOCUMENTS

| | | |
|---|---|---|
| JP | 2003179029 A | 6/2003 |
| JP | 2013161960 A | 8/2013 |
| KR | 101918253 B1 | 11/2018 |

OTHER PUBLICATIONS

PCT International Search Report and Written Opinion in PCT/US2020/057145 dated Feb. 10, 2021, 10 pages.

*Primary Examiner* — Asok K Sarkar
(74) *Attorney, Agent, or Firm* — Servilla Whitney LLC

(57) ABSTRACT

Methods of depositing a film using a plasma enhanced process are described. The method comprises providing continuous power from a power source connected to a microwave plasma source in a process chamber and a dummy load, the continuous power split into pulses having a first time and a second time defining a duty cycle of a pulse. The continuous power is directed to the microwave plasma source during the first time, and the continuous power is directed to the dummy load during the second time.

17 Claims, 2 Drawing Sheets

(56) References Cited

U.S. PATENT DOCUMENTS

| | | | |
|---|---|---|---|
| 2004/0121085 A1* | 6/2004 | Wang | H01L 29/665 |
| | | | 427/255.394 |
| 2012/0090782 A1 | 4/2012 | Ikeda et al. | |
| 2012/0247676 A1* | 10/2012 | Fujino | H01J 37/32211 |
| | | | 118/723 MW |
| 2018/0025930 A1 | 1/2018 | Agustyniak et al. | |

* cited by examiner

RF POWER SOURCE OPERATION IN PLASMA ENHANCED PROCESSES

CROSS-REFERENCE TO RELATED APPLICATIONS

This application claims priority to U.S. Provisional Application No. 62/926,063, filed Oct. 25, 2019, the entire disclosure of which is hereby incorporated by reference herein.

TECHNICAL FIELD

Embodiments of the disclosure generally relate to apparatus for plasma enhanced substrate processing. More particularly, embodiments of the disclosure relate to operation of RF power sources in plasma enhanced deposition processes.

BACKGROUND

Plasma-Enhanced CVD (PECVD) and Plasma-Enhanced ALD (PEALD) are deposition techniques that offer control of film thickness and conformality in high-aspect ratio structures. Due to continuously decreasing device dimensions in the semiconductor industry, there is increasing interest and applications that use PECVD and PEALD. In some cases, only plasma enhanced deposition processes can meet specifications for desired film thickness and conformality.

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Typically, PECVD and PEALD tools use capacitive plasma sources in RF/VHF frequency band up to several tens of MHz. These plasmas have moderate densities and can have relatively high ion energies. Using microwave fields at frequencies in GHz range instead, in certain resonant or wave-propagation electromagnetic modes, plasma of very high charge and radical densities and with very low ion energies can be generated. The plasma densities can be in the range of $10^{12}/cm^3$ or above and ion energies can be as low as ~5-10 eV. Such plasma features are becoming increasingly important in damage-free processing of semiconductor devices.

One challenge for microwave plasmas is microwave/RF source reliability problems due to a high number of power on/off cycles. Typically, in depositing multi-layer films, the power is kept on constantly to prevent premature power source failure. Constant plasma ON between process steps causes undesired interface layer formation. To address the source reliability issues, present sources have to switch from no power to full process power millions of cycles a year. The power cycles cause thermal stress on output chips in the source, thus reducing source reliability.

Therefore, there is a need in the art for improved methods for depositing or forming a material on a substrate by a plasma enhanced technique.

SUMMARY

One or more embodiments of the disclosure are directed to a method. A method comprises providing continuous power from a power source connected to a microwave plasma source in a process chamber and a dummy load, the continuous power split into pulses having a first time and a second time defining a duty cycle of a pulse; directing the continuous power to the microwave plasma source during the first time; and directing the continuous power to the dummy load during the second time.

Additional embodiments of the disclosure are directed to a method of depositing a film. In one or more embodiments, the method of depositing a film comprises exposing a substrate surface to an oxygen-containing precursor, a nitrogen-containing precursor, and a plasma during a plasma-enhanced process comprising pulsing the oxygen-containing precursor, the nitrogen-containing precursor, and generating the plasma to deposit alternating layers of an oxide and a nitride on the substrate, wherein during the plasma-enhanced process, power is diverted to an alternative load between pulsing of the oxygen-containing precursor and pulsing of the nitrogen-containing precursor.

Further embodiments of the disclosure are directed to a plasma enhanced deposition process. In one or more embodiments, a plasma enhanced deposition process comprises: exposing a substrate to an oxygen-containing precursor and generating a plasma to deposit an oxide layer on the substrate; diverting a power source to an alternative load; and exposing the substrate to a nitrogen-containing precursor and generating plasma to deposit a nitride layer on the oxide layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
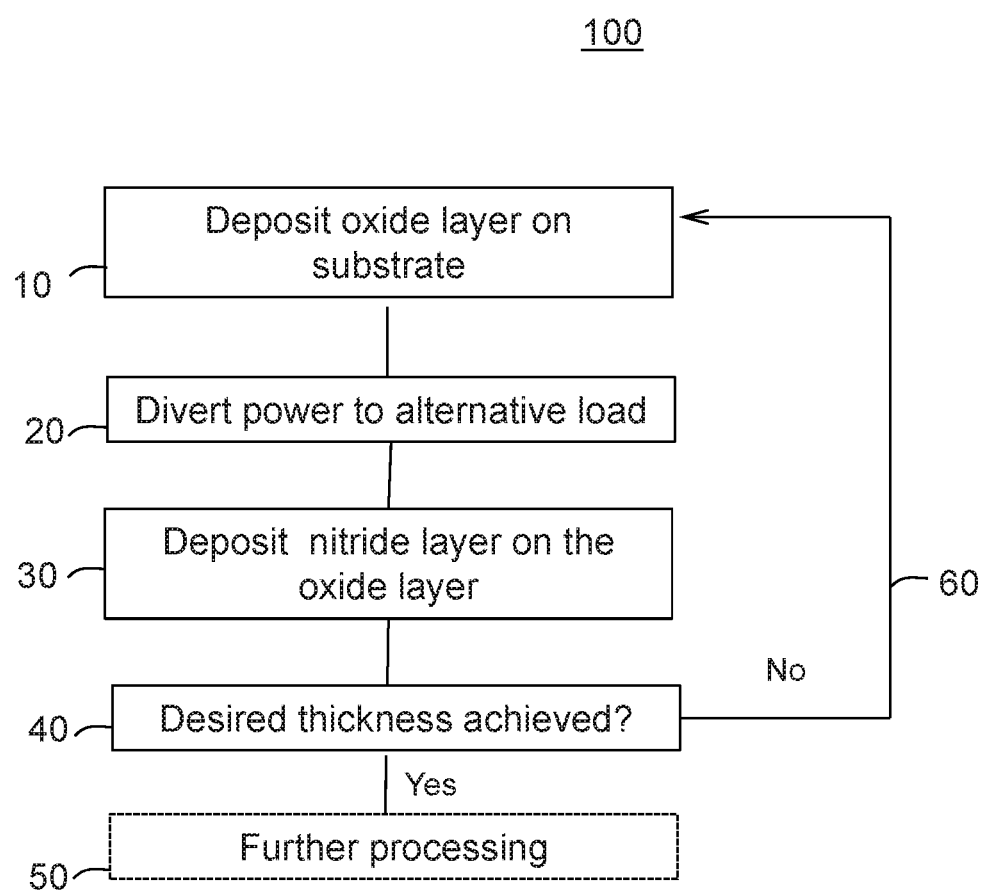
FIG. 1 illustrates a process flow diagram for a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to methods of depositing a material on a substrate by a plasma enhanced technique, such as, for example, by a plasma enhanced atomic layer deposition (PEALD) process or a plasma enhanced chemical vapor deposition (PECVD process).

Plasma enhanced atomic layer deposition (PEALD) is a widely used technique for depositing thin films on a substrate. In some examples of PEALD processes, a material may be formed from the same chemical precursors as thermal ALD processes, but at a higher deposition rate and a lower temperature. A PEALD process, in general, provides that a reactant gas and a reactant plasma are sequentially introduced into a process chamber containing a substrate. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step may be conducted between the delivery of each of the reactants. Embodiments described herein in reference to a PEALD process can be carried out using any suitable thin film deposition system. Any apparatus description described herein is illustrative and should not be construed or interpreted as limiting the scope of the embodiments described herein.

Plasma enhanced chemical vapor deposition (PECVD) is used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

Conventionally, plasma is generated using a radio frequency (RF) powered plasma source. In a typical radio frequency powered plasma source, alternating current (AC) power is rectified and switched to provide current to a RF amplifier. The RF amplifier operates at a reference frequency (13.56 MHz, for example), drives current through an output-matching network, and then through a power measurement circuit to the output of the power supply. The output match is usually designed to be connected a generator that is optimized to drive particular impedance, such as, for example, 50 ohms, in order to have the same characteristic impedance as the coaxial cables commonly used in the industry. Power flows through the matched cable sections, is measured by the match controller, and is transformed through the load match. The load match is usually a motorized automatic tuner, so the load match operation incurs a predetermined time delay before the system is properly configured. After passing through the load match, power is then channeled into a plasma excitation circuit that drives two electrodes in an evacuated processing chamber. A processing gas is introduced into the evacuated processing chamber, and when driven by the circuit, plasma is generated. Since the matching network or the load match is motorized, the response time from the matching network is typically on the order of one second or more.

PEALD and PECVD tools use capacitive plasma sources in RF/VHF frequency band up to several tens of MHz. These plasmas have moderate densities and can have relatively high ion energies. Microwave plasma systems use microwaves to create and maintain the plasma during the semiconductor processes. The most commonly used plasma systems use a radio frequency (RF) of 13.56 MHz for excitation. Microwave systems, however, are usually excited at 2.450 GHz. Early microwave plasma systems suffered from frequency and power instability, making the systems hard to excite with poor uniformity during production. Because microwave-based systems produce much higher radical densities compared to 13.56 MHz RF plasma systems, the microwave-based systems are of use in the semiconductor industry.

In the formation/deposition of multi-layer films the power source is constantly kept on to prevent premature power source failure. Constant plasma on between process steps, however, causes the formation of an undesired interface layer, particularly in the case of the formation of oxide/nitride (ON) stacks. To address the source reliability issue, plasma sources have to switch from no power to full process (i.e. off/on) power millions of cycles a year. The significant number of power cycles cause thermal stress on the output chip, thus reducing the power source reliability.

Accordingly, one or more embodiments advantageously provide a method of preventing undesired interface layer formation between nitride and oxide layers in an oxide/nitride (ON) stack by diverting microwave RF power to an alternative load. As used herein, the term "alternative load" refers to a dummy load or other process chamber operating with timing offset from the original process chamber.

The method of one or more embodiments permits the power source to produce continuous power without a change in the operating regime, while actual process power in the processing chamber is interrupted to prevent undesired interface formation between oxide and nitride layers on a substrate. In one or more embodiments, elimination of microwave/RF source reliability issues due to high number of power on/off cycles is provided.

FIG. 1 illustrates a process flow diagram of a method 100 according to one or more embodiments. At operation 10, an oxide layer is deposited on a substrate. At operation 20, power is diverted to an alternative load. At operation 30, a nitride layer is deposited on the oxide layer. At decision point 40, it is determined whether the desired thickness of the oxide/nitride stack has been achieved. If the desired thickness has been achieved, the stack is provided for further processing at operation 50. If the desired thickness has not been achieved, the process returns 60 to operation 10 where an oxide is deposited. As recognized by those skilled in the art, forming an oxide/nitride (ON) stack comprises the formation of alternating layers of oxide and nitride. One of skill in the art understands that the order of this layering depends upon many factors, and this process flow is not meant to be limiting. In other words, operation 10 may start with the deposition of a nitride layer, and operation 30 may comprise the deposition of an oxide layer on the nitride layer.

Figure 2:
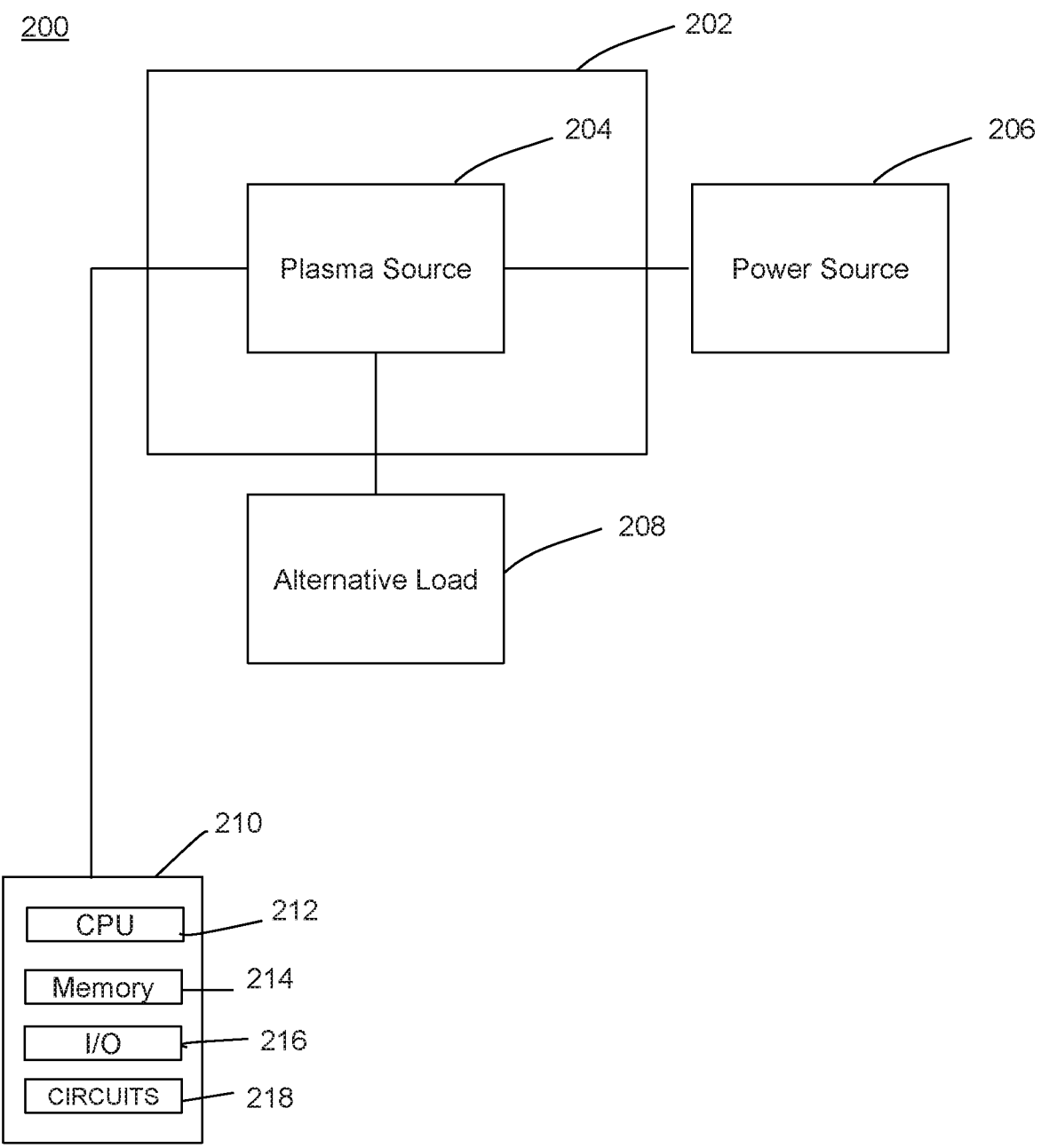
FIG. 2 illustrates schematic diagram of a processing tool according to one or more embodiments.

FIG. 2 illustrates an embodiment of a processing tool 200 in which a power source 206 is connected to a plasma source 204; e.g. a microwave plasma source, and an alternative load 208, e.g. a dummy load. In one or more embodiments, the power source 206 provides continuous power in a process chamber 202. In one or more embodiments, the continuous power splits into pulses having a first time and a second time defining a duty cycle of a pulse. In one or more embodiments, the continuous power is directed to the plasma source 204 during the first time, and the continuous power is directed to the alternative load 208 during the second time.

In one or more embodiments, the power source 206 is continuously on, while the plasma is not because the power is being diverted to an alternative load to cause a duty cycle of the plasma. The cycling of the plasma can occur over any time frame. For example, the plasma may be on for one second and off for one second before the cycle repeats or the plasma may be on for 50 ms and off for 50 ms before the cycle repeats.

Similarly, the active, first time, and inactive, second time, periods of the plasma cycle may be uneven. For example, the plasma may be on for 400 ms and off for 100 ms, or vice versa. The percentage of a cycle in which the plasma is active is referred to as the duty cycle of the plasma. For example, the 400 ms active, first time, and 100 ms inactive, second time, would be a duty cycle of about 80%.

In some embodiments, the duty cycle is in a range of about 5% to about 90%. In some embodiments, the duty cycle is less than or equal to about 90%, less than or equal to about 80%, less than or equal to about 70%, less than or equal to about 60%, less than or equal to about 50%, less than or equal to about 40%, less than or equal to about 30%, less than or equal to about 25%, less than or equal to about 20%, less than or equal to about 15%, or less than or equal to about 10%.

In some embodiments, the plasma power is in a range of about 10 W to about 1000 W. In some embodiments, the plasma power is less than or equal to about 1000 W, or less than or equal to about 500 W.

The plasma frequency may be any suitable frequency. In some embodiments, the plasma has a frequency in a range of about 200 kHz to 30 MHz. In some embodiments, the plasma frequency is less than or equal to about 20 MHz, less than or equal to about 10 MHz, less than or equal to about 5 MHz, less than or equal to about 1000 kHz, or less than or equal to about 500 kHz. In some embodiments, the plasma frequency is greater than or equal to about 210 kHz, greater than or equal to about 250 kHz, greater than or equal to about 600 kHz, greater than or equal to about 750 MHz, greater than or equal to about 1200 kHz, greater than or equal to about 2 MHz, greater than or equal to about 4 MHz, greater than or equal to about 7 MHz, greater than or equal to about 12 MkHz, greater than or equal to about 15 MHz, or greater than or equal to about 25 MHz In one or more embodiments, the alternative load 208 comprises a dummy load and can be a matched termination load or a reactive load (fixed or movable short), or a combination of dummy load and reactive load. In some embodiments, the dummy load is a matched termination load from the plasma source.

In one or more embodiments, a controller 210 may be provided and coupled to various components of the processing tool 200 to control the operation thereof. The controller 210 can be a single controller that controls the entire processing tool 200, or multiple controllers that control individual portions of the processing tool 200. For example, the processing tool 200 may include separate controllers for each of the processing chambers 202, plasma source 204, alternative load 208, and power source 206.

In some embodiments, the processing chamber 202 further comprises a controller 210 connected to the plasma source 204. In one or more embodiments, the controller 210 controls the ignition of the plasma by the plasma source 204 and within the processing chamber 202.

In some embodiments, the controller 210 includes a central processing unit (CPU) 212, a memory 214, input/outputs (I/O) 216, and support circuits 218. The controller 210 may control the processing tool 200 directly, or via computers (or controllers) associated with particular process chamber and/or support system components.

The controller 210 may be one of any form of general-purpose computer processor that can be used in an industrial setting for controlling various chambers and sub-processors. The memory 214 or computer readable medium of the controller 210 may be one or more of readily available memory such as random access memory (RAM), read only memory (ROM), floppy disk, hard disk, optical storage media (e.g., compact disc or digital video disc), flash drive, or any other form of digital storage, local or remote. The memory 214 can retain an instruction set that is operable by the processor (CPU 212) to control parameters and components of the processing tool 200.

The support circuits 218 are coupled to the CPU 212 for supporting the processor in a conventional manner. These circuits include cache, power supplies, clock circuits, input/output circuitry and subsystems, and the like. One or more processes may be stored in the memory 214 as software routine that, when executed or invoked by the processor, causes the processor to control the operation of the processing tool 200 or individual processing chambers in the manner described herein. The software routine may also be stored and/or executed by a second CPU (not shown) that is remotely located from the hardware being controlled by the CPU 212.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 210 has one or more configurations to execute individual processes or sub-processes to perform the method. The controller 210 can be connected to and configured to operate intermediate components to perform the functions of the methods. For example, the controller 210 can be connected to and configured to control one or more of the plasma source, the power source, the alternative load, or other components.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method comprising:
    providing continuous power from a power source that is continuously on, the power source connected to a microwave plasma source in a process chamber and a dummy load, the continuous power split into pulses having a first time and a second time defining a duty cycle of a pulse;
    directing the continuous power to the microwave plasma source during the first time; and
    directing the continuous power to the dummy load during the second time.

2. The method of claim 1, further comprising igniting a plasma in the microwave plasma source during the first time.

3. The method of claim 2, wherein an oxide layer is deposited on a substrate during the first time.

4. The method of claim 3, further comprising repeating the duty cycle.

5. The method of claim 4, wherein a nitride layer is deposited on the oxide layer during the first time.

6. A method of depositing a film, the method comprising:
    exposing a substrate surface to an oxygen-containing precursor, a nitrogen-containing precursor, and a plasma during a plasma-enhanced process comprising pulsing the oxygen-containing precursor, the nitrogen-containing precursor, and generating the plasma to deposit alternating layers of an oxide and a nitride on the substrate, wherein during the plasma-enhanced process, continuous power is provided by a power source that is continuously on, the power source is connected to a microwave plasma source and an alternative load, and the continuous power is diverted to an alternative load between pulsing of the oxygen-containing precursor and pulsing of the nitrogen-containing precursor.

7. The method of claim 6, wherein the continuous power is split into pulses having a first time and a second time defining a duty cycle of a pulse.

8. The method of claim 7, wherein the continuous power is directed to the microwave plasma source during the first time.

9. The method of claim 8, wherein the continuous power is diverted to the alternative load during the second time.

10. The method of claim 8, further comprising igniting a plasma during the first time to deposit one or more of the oxide layer or the nitride layer.

11. The method of claim 6, wherein the plasma comprises one or more of nitrogen ($N_2$), argon (Ar), helium (He), hydrogen ($H_2$), oxygen ($O_2$), carbon monoxide (CO), or carbon dioxide ($CO_2$).

12. A method for a plasma-enhanced deposition, the method comprising:
    exposing a substrate to an oxygen-containing precursor and generating a plasma to deposit an oxide layer on the substrate;
    diverting a power source that is connected to a microwave plasma source in a process chamber and an alternative load, is continuously on, and provides continuous power, to the alternative load; and
    exposing the substrate to a nitrogen-containing precursor and generating plasma to deposit a nitride layer on the oxide layer.

13. The method of claim 12, wherein the continuous power is split into pulses having a first time and a second time defining a duty cycle of a pulse.

14. The method of claim 13, wherein the continuous power is directed to the microwave plasma source during the first time.

15. The method of claim 14, wherein the continuous power is diverted to the alternative load during the second time.

16. The method of claim 15, further comprising igniting a plasma during the first time to deposit one or more of the oxide layer or the nitride layer.

17. The method of claim 12, wherein the plasma comprises one or more of nitrogen ($N_2$), argon (Ar), helium (He), hydrogen ($H_2$), oxygen ($O_2$), carbon monoxide (CO), or carbon dioxide ($CO_2$).

* * * * *